US006856123B2

(12) United States Patent
Takabayashi

(10) Patent No.: US 6,856,123 B2
(45) Date of Patent: Feb. 15, 2005

(54) SEMICONDUCTOR DEVICE PROVIDED WITH REGULATOR CIRCUIT HAVING REDUCED LAYOUT AREA AND IMPROVED PHASE MARGIN

(75) Inventor: Yasutaka Takabayashi, Yamanashi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/392,928

(22) Filed: Mar. 21, 2003

(65) Prior Publication Data

US 2004/0065899 A1 Apr. 8, 2004

(30) Foreign Application Priority Data

Sep. 13, 2002 (JP) ....................................... 2002-268747

(51) Int. Cl.[7] .................................................. G05F 1/59
(52) U.S. Cl. ...................................................... 323/273
(58) Field of Search .................................. 323/273, 280

(56) References Cited

U.S. PATENT DOCUMENTS 5,355,078 A * 10/1994 Demizu ...................... 323/281
5,548,205 A * 8/1996 Monticelli .................. 323/274
5,578,960 A * 11/1996 Matsumura et al. ........ 327/535
5,686,820 A * 11/1997 Riggio, Jr. .................. 323/273
5,861,736 A * 1/1999 Corsi et al. ................. 323/273
6,249,112 B1 * 6/2001 Khouri et al. .............. 323/282
6,300,749 B1 * 10/2001 Castelli et al. .............. 323/273
6,713,993 B2 * 3/2004 Descombes ................. 323/273

FOREIGN PATENT DOCUMENTS

JP 05090502 A 4/1993 ........... H01L/27/04

* cited by examiner

*Primary Examiner*—Jeffrey Sterrett
(74) *Attorney, Agent, or Firm*—Volentine Francos & Whitt, PLLC

(57) ABSTRACT

A semiconductor device having a regulator circuit includes a transistor having a source and a drain connected to a power supply and an output terminal; first and second voltage divider resistance elements connected in series between ground and the transistor output terminal; a differential operational amplifier that differentially amplifies a reference voltage and a voltage divided by the voltage divider resistance elements, and that supplies the amplified voltages to a gate of the transistor, to control an output voltage of the transistor; and a phase compensation capacitor including an interlayer film between electrode layers and overlaid two-dimensionally on the voltage divider resistance elements. The electrode layer close to the semiconductor substrate is connected to the output terminal of the transistor, and a parasitic capacitance between the output terminal of the transistor and the voltage divider resistance elements compensates a phase lag of a transistor output signal.

14 Claims, 9 Drawing Sheets

I1
MPO
RA
RB
C1

SEMICONDUCTOR DEVICE PROVIDED WITH REGULATOR CIRCUIT HAVING REDUCED LAYOUT AREA AND IMPROVED PHASE MARGIN

BACKGROUND OF THE INVENTION

1. Field of the Invention

The invention relates to a semiconductor device provided with a regulator circuit on a semiconductor substrate requiring phase compensation.

2. Description of the Related Art

A regulator circuit is generally configured, for example, by a circuit shown in FIG. 1.

The regulator circuit shown in FIG. 1 is configured by a transistor MPO, two voltage divider resistor elements RA (first voltage divider resistor element), RB (second voltage divider resistor element), a differential amplifier 11 (differential operational amplifier element), and a phase compensation capacitor C1.

The transistor MPO is connected to nodes N1, N4 and N5 such that a source and a back bias thereof are connected to the source power supply node N1 (power supply terminal), a gate thereof is connected to the node N4 (differential output terminal of the differential operational amplifier element) and a drain thereof is connected to the regulator voltage output node N5 (output terminal of the transistor MPO), wherein a specific output voltage is outputted to the node N5 based on an input voltage inputted from the node N1.

The first voltage divider resistor element RA is connected to nodes N3 and N5 such that one terminal thereof is connected to the node N3 (non-inverting input terminal of the differential operational amplifier element) and the other terminal thereof is connected to the node N5 (output terminal). The second voltage divider resistor element RB is connected to the node N3 and a GROUND node such that one terminal thereof is connected to the node N3 and the other terminal is connected to the GROUND node (ground terminal). These voltage divider resistor elements RA and RB are connected to each other in series between the node N5 and the GROUND node.

The differential amplifier 11 is connected to the nodes N2 and N3 such that a differential input thereof is connected to the node N2, namely, reference voltage input node N2 (inverting input terminal) and an output thereof is connected to the node N4 (differential output terminal of the differential operational amplifier element). Further, a power supply of the differential amplifier 11 is connected to the source power supply node N1 (power supply terminal) and a current power supply thereof is connected to a source current node N6. The differential amplifier 11 receives a reference voltage and a voltage divided by the voltage divider resistor elements RA and RB from the nodes N2 and N3, and a signal representing the input voltage is differentially amplified, which is in turn outputted to the gate of the transistor MPO through the node N4, thereby controlling an output voltage of the transistor MPO.

The phase compensation capacitor C1 is connected between the nodes N4 and N5, namely, the regulator voltage output node N5.

The regulator circuit of the invention starts operation when a voltage is supplied to the nodes N1, N2 and a current is supplied to the node N6. The differential amplifier 11 outputs a voltage which is lower than a threshold voltage of the transistor MPO if the potential of the node N3 is lower than that of the node N2 while it outputs a voltage which is higher than the threshold voltage of the transistor MPO if the potential of the node N3 is higher than that of the node N2, thereby controlling the gate of the transistor MPO. Since the differential amplifier 11, the transistor MPO and the first voltage divider resistor element RA constitute a feedback loop, the potential of the node N3 converges on a potential which is the same as that of the node N2, and a fixed voltage which is decided by a ratio between the resistances of the voltage divider resistor elements RA and RB is outputted to the node N5.

The phase compensation capacitor C1 compensates a phase lag caused by a response lag of each component constituting the feedback loop, namely, response lag in the differential amplifier 11, the transistor MPO and the first voltage divider resistor element RA, and it is disposed between the nodes N4 and N5, thereby serving to loose no time in transmitting the response of the node N4 to the node N5. As a result, the response lag in the transistor MPO is cancelled, thereby preventing oscillation thereof.

However, as shown in FIG. 2, the conventional semiconductor device has a problem that layout areas of the components thereof become large because the voltage divider resistor elements RA and RB, the differential amplifier 11, the transistor MPO, and the phase compensation capacitor C1 are disposed in independent layout areas, wherein the layout area of the phase compensation capacitor C1 is provided separately from those of the other components.

There is proposed a semiconductor device wherein a capacitor is overlaid two-dimensionally on a resistor element in order to improve the increase of layout areas of the components of the semiconductor device, for example, as disclosed in JP-A 05-090502. According to this proposal, a capacitor overlaid two-dimensionally on a resistor element constituting an RC filter circuit, thereby improving the increase of layout areas of the components, thereby rendering the semiconductor device small in chip.

Meanwhile, even in a regulator circuit of the semiconductor device, it is considered to improve the increase of layout areas of the components in the same manner set forth above, however, this regulator circuit has a problem of security of a phase margin of the phase compensation capacitor (capacitor element) which is overlaid two-dimensionally on a resistor element. If the phase margin of the phase compensation capacitor is lowered, the phase compensation of the regulator circuit is not satisfactorily effected, arising a problem of generation of oscillation of the regulator circuit.

SUMMARY OF THE INVENTION

It is an object of the invention to provide a semiconductor device provided with a regulator circuit capable of reducing a layout area thereof and improving a phase margin. To achieve this object, the semiconductor device provided with a regulator circuit comprises (a) a transistor having a source and a drain either of which is connected to a power supply terminal and the other of which is connected to an output terminal thereof, (b) voltage divider resistance elements comprising a first voltage divider resistor element and a second voltage divider resistor element connected to each other in series between a ground terminal and the output terminal of the transistor, (c) a differential operational amplifier element for differentially amplifying a reference voltage inputted to an inverting input terminal thereof and a voltage divided by the voltage divider resistor elements and inputted to a non-inverting input terminal thereof and supplying these amplified voltages to a gate of the transistor, thereby controlling an output voltage of the transistor, and (d) a phase compensation capacitor formed of an interlayer film between electrode layers and overlaid two-dimensionally on the voltage divider resistor elements, wherein the electrode layer close to the semiconductor substrate is connected to the output terminal of the transistor, and a capacitance is caused to be parasitic between the output terminal of the transistor and the voltage divider resistor elements, thereby compensating a phase lag of an output signal from the transistor.

DETAILED DESCRIPTION OF THE PREFERRED EMBODIMENTS

First to fifth embodiments of the invention are now described with reference to the attached drawings. Components having substantially the same function are depicted by and explained with reference to the same numerals throughout the drawings, and the explanation thereof is omitted in some case.

First Embodiment

Figure 1:
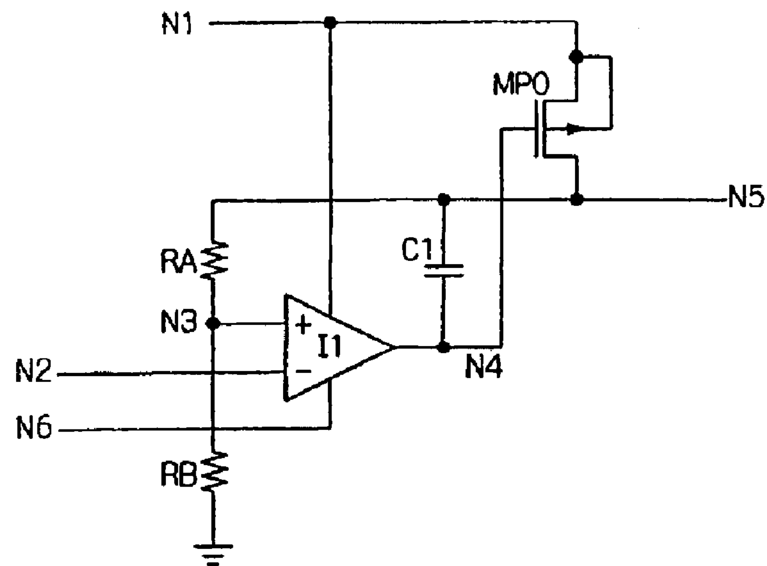
FIG. 1 is a circuit diagram showing an example of a regulator circuit of a conventional semiconductor device.
Figure 2:
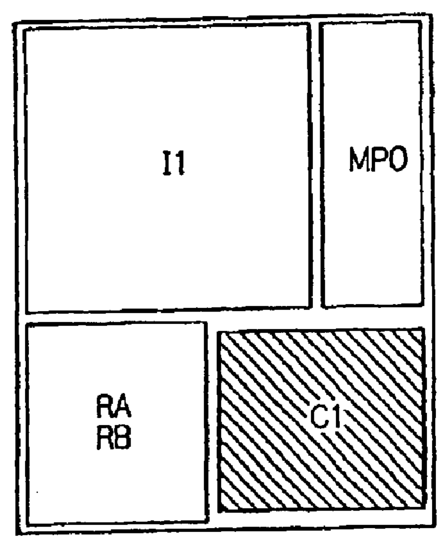
FIG. 2 is a view showing a layout configuration of the regulator circuit of the conventional semiconductor device.
Figure 3:
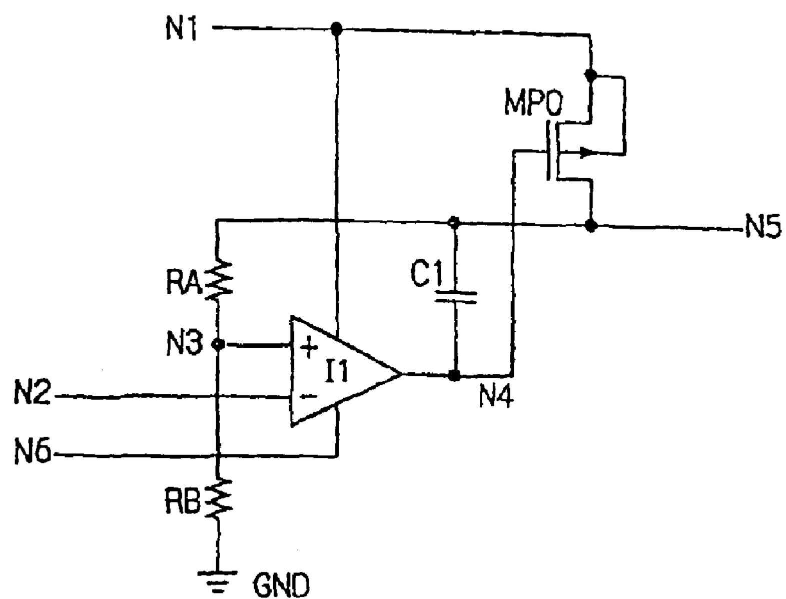
FIG. 3 is a circuit diagram of a regulator circuit of a semiconductor device according to a first embodiment of the invention.
Figure 4:
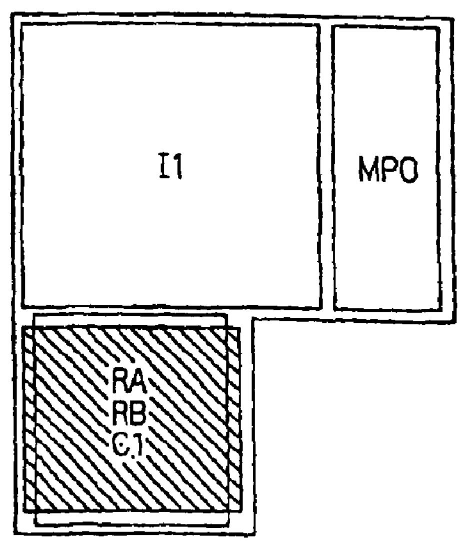
FIG. 4 is a view showing a layout configuration of the regulator circuit of the semiconductor device according to the first embodiment.
Figure 5:
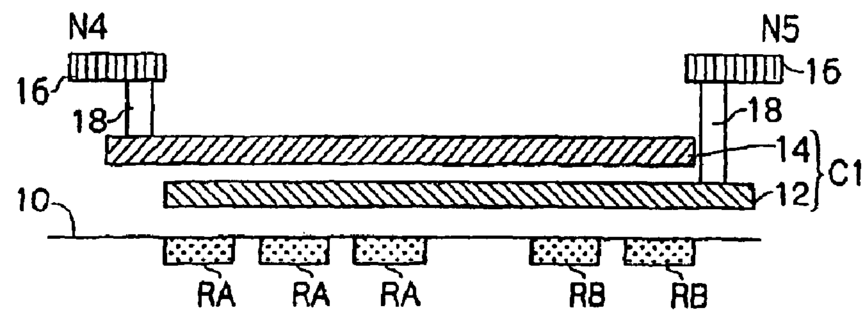
FIG. 5 is a partial sectional view of the regulator circuit of the semiconductor device according to the first embodiment.
Figure 6:
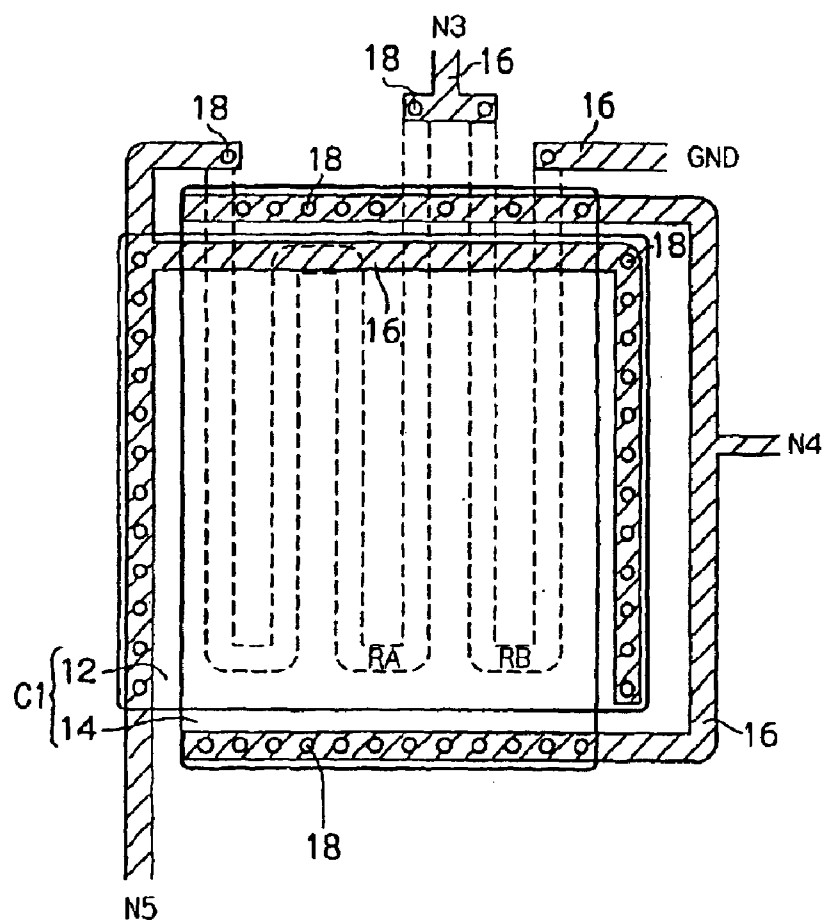
FIG. 6 is a partial plan view of the regulator circuit of the semiconductor device according to the first embodiment.

FIG. 3 is a circuit diagram of a regulator circuit of a semiconductor device according to the first embodiment of the invention. FIG. 4 is a view showing a layout image of the regulator circuit of the semiconductor device according to the first embodiment. FIG. 5 is a partial sectional view of the regulator circuit of the semiconductor device according to the first embodiment. FIG. 6 is a partial plan view of the regulator circuit of the semiconductor device according to the first embodiment.

The semiconductor device is provided with the regulator circuit, as shown in FIGS. 3 to 6, which comprises a transistor MPO, two voltage divider resistor elements RA (first voltage divider resistor element), RB (second voltage divider resistor element), a differential amplifier 11 (differential operational amplifier element), and a phase compensation capacitor C1.

The transistor MPO is connected to nodes N1, N4 and N5 such that a source and a back bias thereof are connected to the source power supply node N1 (power supply terminal), a gate thereof is connected to the node N4 (differential output terminal of the differential operational amplifier element) and a drain thereof is connected to the regulator voltage output node N5 (output terminal of the transistor MPO), wherein a specific output voltage is outputted to the node N5 based on an input voltage inputted from the node N1.

The first voltage divider resistor element RA is connected to a node N3 (non-inverting input terminal of the differential operational amplifier element) and the node N5 such that one terminal thereof is connected to the node N3 and the other terminal thereof is connected to the node N5. The second voltage divider resistor element RB is connected to the node N3 and a GROUND node (ground terminal) such that one terminal thereof is connected to the node N3 and the other terminal is connected to the GROUND node. These voltage divider resistor elements RA and RB are connected to each other in series between the node N5 and the GROUND node.

The differential amplifier 11 is connected to the nodes N2 and N3 such that a differential input thereof is connected to the node N2, namely, a reference voltage input node N2 (inverting input terminal) and an output thereof is connected to the node N4 (differential output terminal of the differential operational amplifier element). Further, a power supply of the differential amplifier 11 is connected to the source power supply node N1 (power supply terminal) and a current power supply thereof is connected to a source current node N6. The differential amplifier 11 receives a reference voltage and a voltage divided by the voltage divider resistor elements RA and RB from the nodes N2 and N3, and these voltages are amplified differentially, which are in turn outputted to the gate of the transistor MPO through the node N4, thereby controlling the output voltage of the transistor MPO.

The phase compensation capacitor C1 is connected between the nodes N4 and N5, namely, the regulator voltage output node N5.

Further, as shown in FIG. 4, both the transistor MPO and the differential amplifier 11 (differential operational amplifier element) are formed on independent layout areas, respectively, while the phase compensation capacitor C1 is formed on layout areas of both the voltage divider resistor elements RA and RB. That is, the phase compensation capacitor C1 is formed on the entire surfaces of the voltage divider resistor elements RA and RB while overlaid two-dimensionally on both the voltage divider resistor elements RA and RB.

Still further, as shown in FIGS. 5 and 6, the voltage divider resistor elements RA and RB are configured such that they are formed in a shape of a pulse waveform on a semiconductor substrate 10 by bending a diffusion layer such as an N well or P well thereof which is thin in dopant concentration and high in resistance. The phase compensation capacitor C1 is constituted by an interlayer film (e.g. $NO_2$, $SiO_2$ or the like) formed between polysilicon layers 12 (1 poly) and 14 (2 poly) serving as a pair of electrode layers which are formed on the entire surfaces of the voltage divider resistor elements RA and RB while overlaid two-dimensionally on the voltage divider resistor elements RA and RB. The phase compensation capacitor C1 is connected to the nodes N4 and N5 such that the polysilicon layer 12 close to the semiconductor substrate 10 is connected to the node N5 through a metal layer 16 via a contact layer 18 while the polysilicon layer 14 remote from the semiconductor substrate 10 is connected to the node N4 through the metal layer 16 via the contact layer 18.

Meanwhile, the polysilicon layers are formed on the diffusion layer as the voltage divider resistor elements RA and RB are formed via a field oxide film (e.g. $NO_2$, $SiO_2$ or the like), wherein if the field oxide film is formed thick, the voltage divider resistor elements RA and RB and the phase compensation capacitor C1 can be independently functioned without forming other elements such as a transistor.

According to the first embodiment, a capacitance is rendered parasitic between the node N5 and the voltage divider resistor elements RA and RB by providing the phase compensation capacitor C1 which is overlaid two-dimensionally on the voltage divider resistor elements RA and RB, and connecting the polysilicon layer 12 of the phase compensation capacitor C1 close to the semiconductor substrate 10 to the node N5, and connecting the polysilicon layer 14 of the phase compensation capacitor C1 remote from the semiconductor substrate 10 to the node N4. Supposing that the polysilicon layer 12 of the phase compensation capacitor C1 close to the semiconductor substrate 10 is connected to the node N4 and the polysilicon layer 14 of the phase compensation capacitor C1 remote from the semiconductor substrate 10 is connected to the node N5, a parasitic capacitance is generated between the node N4 and the voltage divider resistor elements RA and RB, however, this parasitic capacitance is the one which reduces the effect of the phase compensation capacitor C1. Accordingly, in the first embodiment, the phase compensation capacitor C1 is formed on the entire surfaces of the voltage divider resistor elements RA and RB while overlaid two-dimensionally on the voltage divider resistor elements RA and RB, and a parasitic capacitance is generated between the node N5 and the voltage divider resistor elements RA and RB. As a result, the phase compensation capacitor C1 compensates a phase lag caused by the output response lag of the differential amplifier 11, and the capacitance which is parasitic between the node N5 and the voltage divider resistor elements RA and RB serves as a bypass capacitor for connecting between the nodes N5 and N3, thereby leading the phase of the circuit.

As mentioned above, according to the first embodiment, layout areas of the components can be reduced and a phase margin can be improved. Since the phase margin is improved, the size of the phase compensation capacitor C1 can be made smaller than that which has been required so far, so that the layout areas can be more reduced.

Second Embodiment

Figure 7:
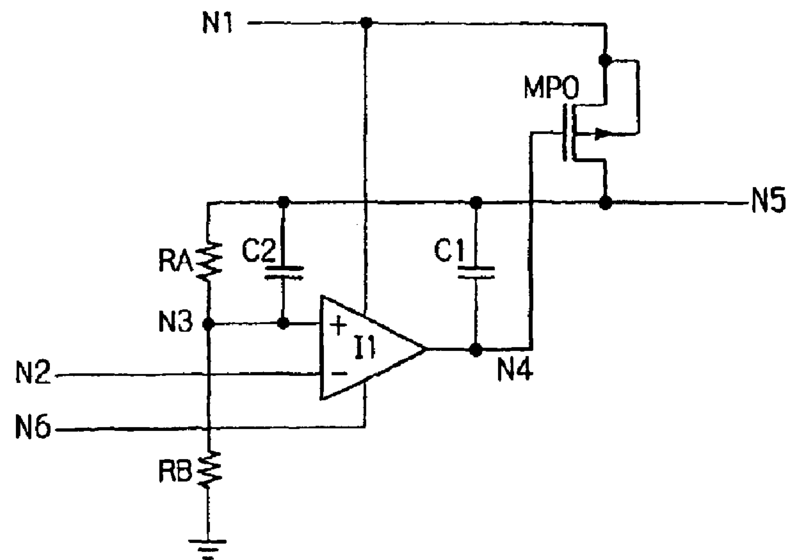
FIG. 7 is a circuit diagram of a regulator circuit of a semiconductor device according to a second embodiment of the invention.
Figure 8:
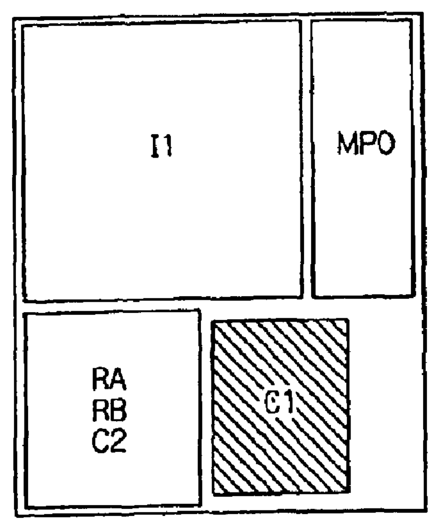
FIG. 8 is a view showing a layout configuration of the regulator circuit of the semiconductor device according to the second embodiment.
Figure 9:
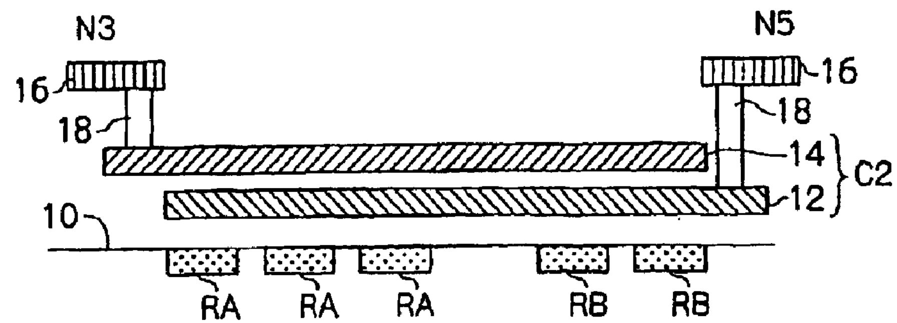
FIG. 9 is a partial sectional view of the regulator circuit of the semiconductor device according to the second embodiment.
Figure 10:
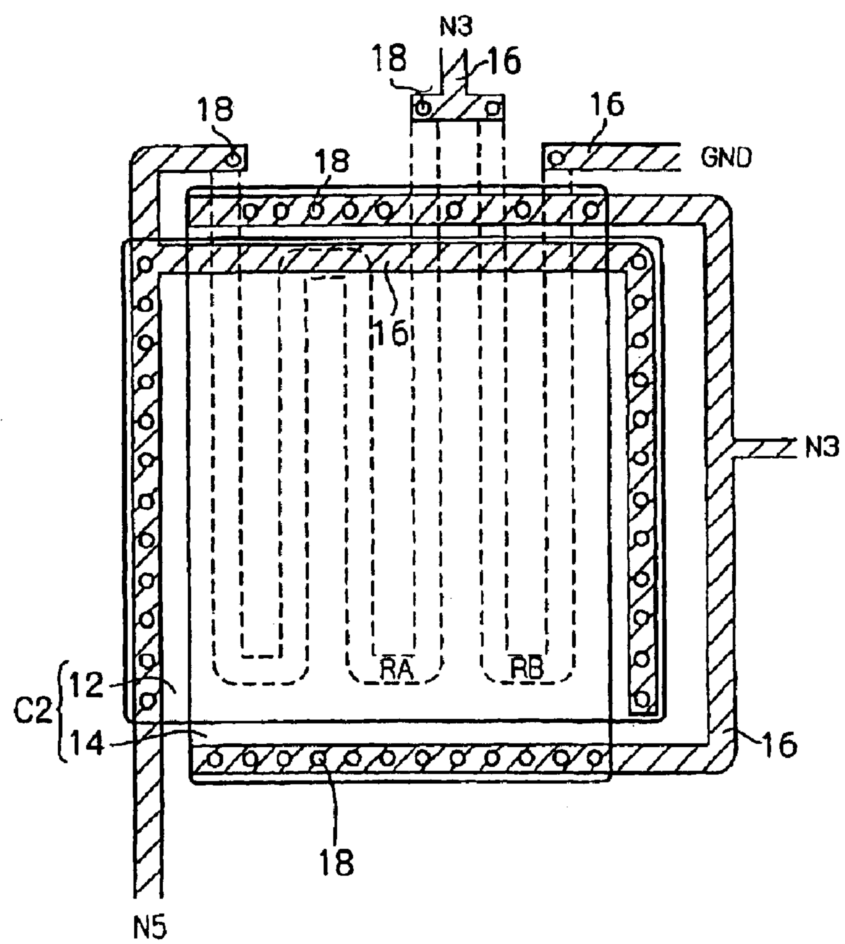
FIG. 10 is a partial plan view of the regulator circuit of the semiconductor device according to the second embodiment.

FIG. 7 is a circuit diagram of a regulator circuit of a semiconductor device according to a second embodiment of the invention. FIG. 8 is a view showing a layout image of the regulator circuit of the semiconductor device according to the second embodiment. FIG. 9 is a partial sectional view of the regulator circuit of the semiconductor device according to the second embodiment. FIG. 10 is a partial plan view of the regulator circuit of the semiconductor device according to the second embodiment.

The semiconductor device of the second embodiment is configured such that each component, i.e. a transistor MPO, a differential amplifier 11 and a phase compensation capacitor C1 are formed on individual layout areas, and a new phase compensation capacitor C2 is formed on layout areas of the voltage divider resistor elements RA and RB while overlaid two-dimensionally on the voltage divider resistor elements RA and RB.

Further, as shown in FIG. 9 and FIG. 10, the phase compensation capacitor C2 is constituted by an interlayer film (e.g. $NO_2$, $SiO_2$ and the like) formed between polysilicon layers 12 (1 poly), 14 (2 poly) serving as a pair of electrode layers which are formed on the entire surfaces of the voltage divider resistor elements RA and RB while overlaid two-dimensionally on the voltage divider resistor elements RA and RB The phase compensation capacitor C2 is connected to the nodes N3 and N5 such that the polysilicon layer 12 close to the semiconductor substrate 10 is connected to the node N5 through a metal layer 16 via a contact layer 18 while the polysilicon layer 14 remote from the semiconductor substrate 10 is connected to the node N3 through the metal layer 16 via the contact layer 18.

According to the second embodiment, to minimize the influence caused by a junction capacity which is parasitic between the voltage divider resistor elements RA and RB, which is a main cause of the phase lag, the phase compensation capacitor C2 is connected between the nodes N5 and N3 and formed on the entire surfaces of the voltage divider resistor elements RA and RB while overlaid two-dimensionally on the voltage divider resistor elements RA and RB. As a result, there are effects that an influence of a phase lag caused by a junction capacitance where the phase compensation capacitor C2 is parasitic between the voltage divider resistor elements RA and RB is reduced, a capacitance between the node N5 and the voltage divider resistor parasitic between elements RA and RB serves as a bypass capacitor for connecting between the nodes N5 and N3, thereby reducing the influence of the phase lag caused by the junction capacitance which is the voltage divider resistor elements RA and RB so that the phase leads efficiently.

Still further, according to the second embodiment, the phase margin can be improved by the phase compensation capacitor C2 alone depending on the capacitance value of the phase compensation capacitor C2, and hence a capacitance value of the phase compensation capacitor C1 which is required at first can be reduced sharply. Alternatively, there is a case wherein the phase compensation capacitor C1 per se may be dispensed with. As a result, the phase compensation capacitor C1 is reduced or dispensed with, thereby reducing a layout size.

Third Embodiment

Figure 11:
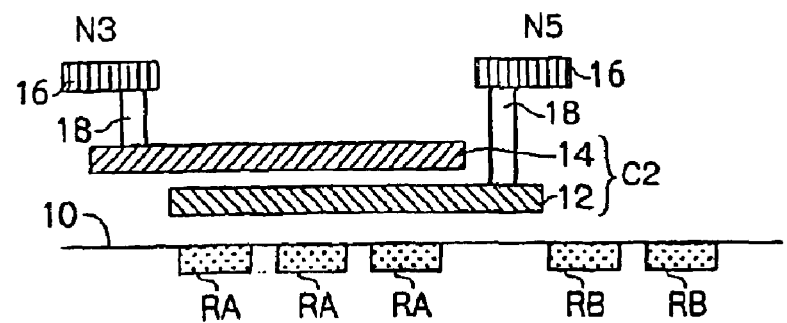
FIG. 11 is a partial sectional view of a regulator circuit of the semiconductor device according to a third embodiment.
Figure 12:
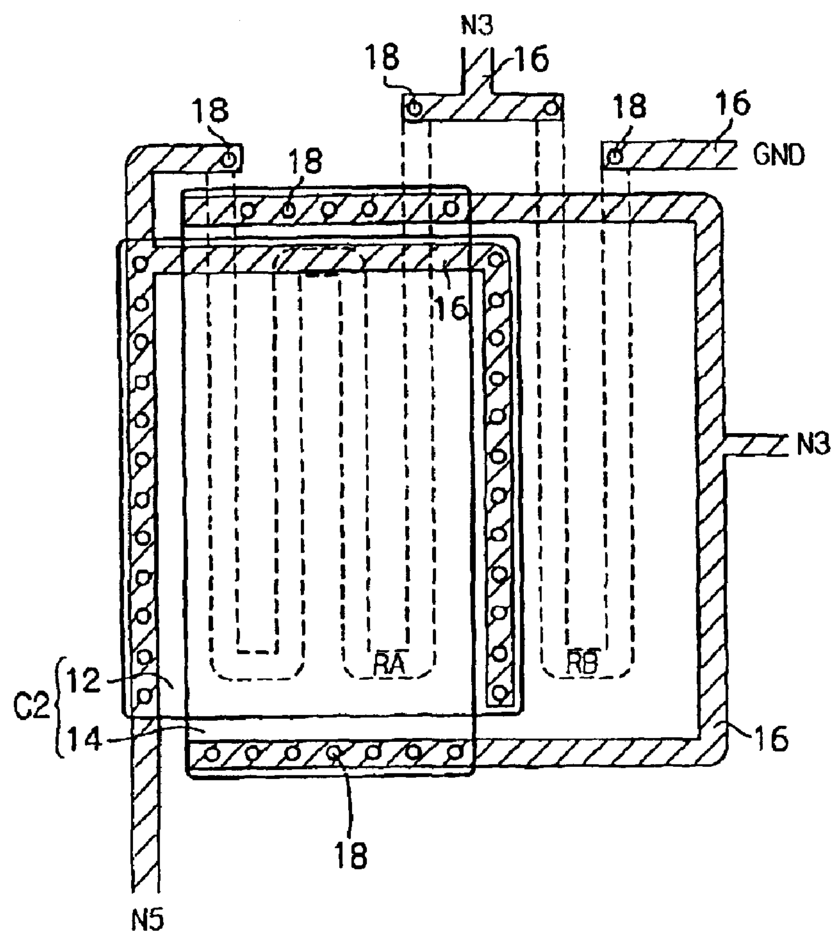
FIG. 12 is a partial plan view of the regulator circuit of the semiconductor device according to the third embodiment.

FIG. 11 is a partial sectional view of the regulator circuit of the semiconductor device according to a third embodiment. FIG. 12 is a partial plan view of the regulator circuit of the semiconductor device according to the third embodiment.

The semiconductor device of the third embodiment is configured, as shown in FIGS. 11 and 12, such that the phase compensation capacitor C2 of the second embodiment is formed on the surface of only a first voltage divider resistor element RA of the voltage divider resistor elements RA and RB, connected to a node N5 while overlaid two-dimensionally on the first voltage divider resistor element RA, so that a capacitance is rendered parasitic only between the node N5 and the first voltage divider resistor element RA. That is, the phase compensation capacitor C2 is configured such that it is not formed on a layout area of the second voltage divider resistor element RB so that a capacitance is not rendered parasitic between the node N5 and the second voltage divider resistor element RB.

According to the semiconductor device of the second embodiment, although the phase compensation capacitor C2 is formed on the entire surfaces of the voltage divider resistor elements RA and RB while overlaid two-dimensionally on the voltage divider resistor elements RA and RB, thereby rendering the capacitance parasitic between the node N5 and the voltage divider resistor elements RA and RB, the capacitance which is parasitic between the node N5 and the second voltage divider resistor element RB causes a phase lag as the capacitance approaches a GROUND node.

Accordingly, according to the third embodiment, the phase compensation capacitor C2 is formed on the surface of only the first voltage divider resistor element RA, connected to the node N5 side, of the voltage divider resistor elements RA and RB while overlaid two-dimensionally on the first voltage divider resistor elements RA, thereby rendering the capacitance not to be parasitic between the node N5 and the second voltage divider resistor element RB connected to the GROUND node which causes the phase lag. That is, the capacitance close to the GROUND node is eliminated, thereby rendering the capacitance parasitic only between the node N5 and the first voltage divider resistor element RA, which leads the phase, thereby efficiently leading the phase of the circuit.

Fourth Embodiment

Figure 13:
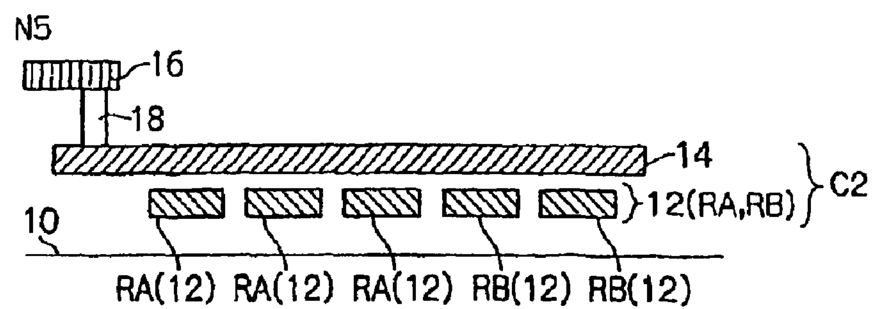
FIG. 13 is a partial sectional view of a regulator circuit of the semiconductor device according to a fourth embodiment.
Figure 14:
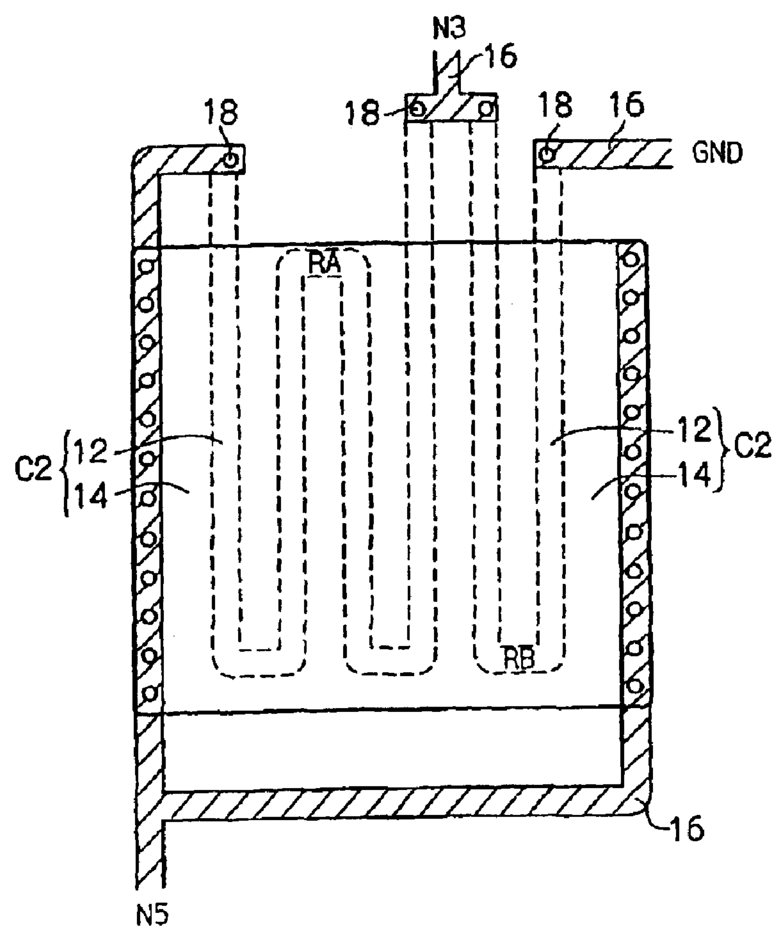
FIG. 14 is a partial plan view of the regulator circuit of the semiconductor device according to the fourth embodiment.
Figure 15:
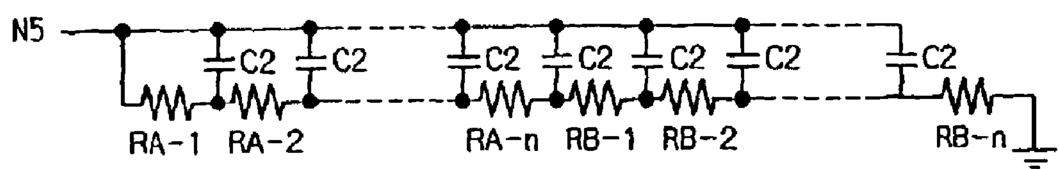
FIG. 15 is a partial circuit diagram of the regulator circuit according to the fourth embodiment.

FIG. 13 is a partial sectional view of the regulator circuit of the semiconductor device according to the fourth embodiment. FIG. 14 is a partial plan view of the regulator circuit of the semiconductor device according to the fourth embodiment. FIG. 15 is a circuit diagram showing a partial circuit diagram of the regulator circuit according to the fourth embodiment.

The semiconductor device according to the fourth embodiment is configured, as shown in FIG. 13 to FIG. 15, such that in the semiconductor device of the second embodiment of the invention, the voltage divider resistor elements RA and RB are formed by the polysilicon layer 12 by bending the polysilicon layer 12 close to the semiconductor substrate 10 of the phase compensation capacitor C2, thereby rendering the capacitance parasitic between the node N5 and the voltage divider resistor elements RA and RB. With such an arrangement, the phase compensation capacitor C2 (including capacitance which is parasitic between the node N5 and the voltage divider resistor elements RA and RB) is configured to be formed in parallel with one another and distributed between the voltage divider resistor elements RA and RB which are divided by n (RA-1 to RA-n, RB-1 to RB-n).

According to the fourth embodiment, the polysilicon layer 12 of the polysilicon layers 12 and 14 constituting the phase compensation capacitor C2, which is close to the semiconductor substrate 10, is configured as the voltage divider resistor elements RA and RB, and an interlayer film between the polysilicon layers 12 and 14 constituting the capacitor is thin, and also a capacitance which is parasitic between the node N5 and the voltage divider resistor elements RA and RB becomes very large so that a phase margin can be more improved, and the layout area of the phase compensation capacitor C2 (voltage divider resistor elements RA and RB) is reduced sharply, thereby reducing the layout are of the circuit.

Further, although the voltage divider resistor elements RA and RB are constituted by the well according to the semiconductor device of the first to third embodiments, the layer of the well are diffusion layers, and hence widths and intervals of the resistors are needed to be wider owing to an influence of widening thereof when finished. Accordingly, the areas of the voltage divider resistor elements RA and RB become large.

On the other hand, since the voltage divider resistor elements RA and RB are constituted by the polysilicon layers, it is not necessary to consider the widening of the voltage divider resistor elements RA and RB owing to the diffusion when finished, and hence the widths and intervals of the respective resistors can be narrower than intervals of the resistors constituted by the diffusion layers, resulting in more reduction of the areas of the voltage divider resistor elements RA and RB.

Further, according to the fourth embodiment, since the capacitance (phase compensation capacitor C2) which is parasitic between the node N5 and the voltage divider resistor elements RA and RB is constituted by two polysilicon layers 12 and 14, the capacitance value thereof is larger than that which is parasitic in the semiconductor device of the second embodiment, thereby enhancing the effect of improvement of the phase margin, so that the layout size of the phase compensation capacitor C1 can be reduced sharply or the phase compensation capacitor C1 can be dispensed with.

Fifth Embodiment

Figure 16:
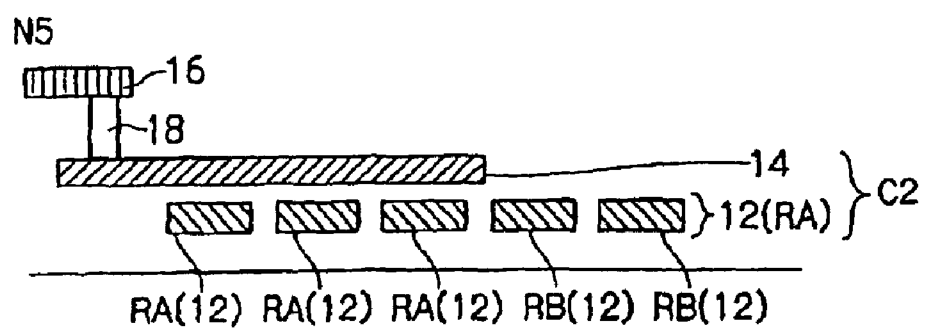
FIG. 16 is a partial sectional view of a regulator circuit of the semiconductor device according to a fifth embodiment.
Figure 17:
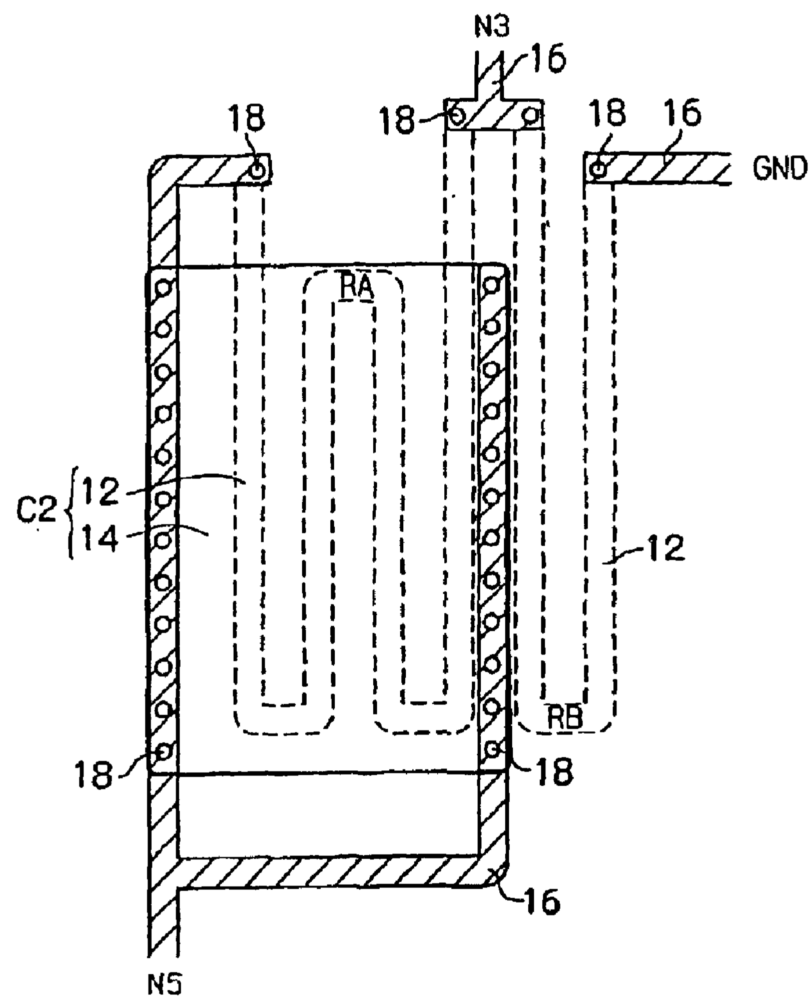
FIG. 17 is a partial plan view of the regulator circuit of the semiconductor device according to the fifth embodiment.
Figure 18:
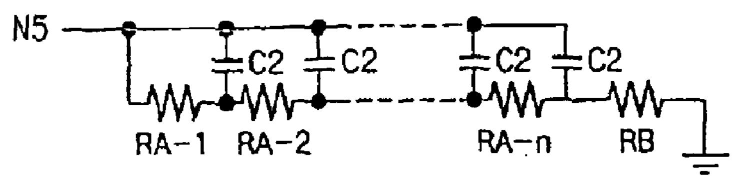
FIG. 18 is a partial circuit diagram of the regulator circuit according to the fifth embodiment.

FIG. 16 is a partial sectional view of the regulator circuit of the semiconductor device according to the fifth embodiment. FIG. 17 is a partial plan view of the regulator circuit of the semiconductor device according to the fifth embodiment. FIG. 18 is a partial circuit diagram of the regulator circuit according to the fifth embodiment.

The semiconductor device of the fifth embodiment is configured, as shown in FIGS. 16 and 17, such that in the semiconductor device of the fourth embodiment, the polysilicon layer 14 of the phase compensation capacitor C2 which is remote from the semiconductor substrate 10 is formed on only the first voltage divider resistor element RA of the voltage divider resistor elements RA and RB, connected to a node N5 while overlaid two-dimensionally on the first voltage divider resistor element RA, whereby the capacitance is rendered parasitic only between the node N5 and the first voltage divider resistor element RA. With such an arrangement, the phase compensation capacitor C2 (including capacitance which is parasitic between the node N5 and the first voltage divider resistor element RA) is configured to be formed in parallel with one another and distributed between the first voltage divider resistor element RA which is divided by n (RA-1 to RA-n) as shown in FIG. 18.

According to the fifth embodiment, since the polysilicon layer 12 of the polysilicon layers 12 and 14 constituting the phase compensation capacitor C2, which is close to the semiconductor substrate 10, is constituted as the voltage divider resistor elements RA and RB while the polysilicon layer 14 of the phase compensation capacitor C2 which is remote from the semiconductor substrate 10 is formed on only the first voltage divider resistor element RA of the voltage divider resistor elements RA and RB, connected to the node N5 while overlaid two-dimensionally on the first voltage divider resistor element RA, the parasitic capacitance between the node N5 and the second voltage divider resistor element RB connected to the GROUND node which causes a phase lag is not generated while the capacitance is rendered parasitic only between the node N5 which leads the phase and the first voltage divider resistor element RA connected to the node N5 in the same manner as the third embodiment, thereby more efficiently leading the phase of the circuit.

According to the semiconductor device of the first to fifth embodiments, although the regulator circuit is explained with reference to one example thereof, the semiconductor device is not limited thereto but can be applied to other regulator circuits.

According to the semiconductor device of the first to fifth embodiments, although the capacitor is explained with reference to that formed of the interlayer film between two polysilicon films, the semiconductor device can be applied to a capacitor formed of an interlayer metal film between multilayer metals or a metal fringing capacitor formed between two metal layers.

According to the semiconductor device of the third embodiment, although the phase compensation capacitor C2 formed of the interlayer film between the polysilicon films is explained with reference to the example overlaid on only the first voltage divider resistor element RA (layout area of the first voltage divider resistor element RA), it can be formed on the layout area of the first voltage divider resistor element RA and a partial layout area of the second voltage divider resistor element RB at the node N3 side.

Although the semiconductor device of the fifth embodiment is explained with reference to the example wherein the polysilicon layer (polysilicon layer connected to the node N5) which is remote from the semiconductor substrate constituting the phase compensation capacitor C2 is formed only on the first voltage divider resistor element RA (a layout region of the first voltage divider resistor element), it can be formed on both the first voltage divider resistor element RA and a part of the layout region of the second voltage divider resistor element RB connected to the node N3.

According to the semiconductor device of the second embodiment, although the polysilicon layer which constitutes the phase compensation capacitor C2 and is remote from the semiconductor substrate 10 is explained with reference to the example connected to the node N5, it can be applied to a case where the polysilicon layer is connected to the node N3.

It is a matter of course that the semiconductor device and the method of manufacturing the same according to the first to fifth embodiments of the invention are not construed limitedly but they can be realized within a scope satisfying the requirements of the invention.

As explained above, the invention can provide the semiconductor device provided with the regulator circuit capable of reducing the layout area and improving the phase margin.

What is claimed is:

1. A semiconductor device provided with a regulator circuit formed on a semiconductor substrate, comprising:

a transistor having a source and a drain, either of which is connected to a power supply terminal and an other of which is connected to an output terminal of the transistor;

a voltage divider comprising a first voltage divider resistor element and a second voltage divider resistor element connected together in series between a ground terminal and the output terminal of the transistor;

a differential operational amplifier element that differentially amplifies a reference voltage inputted to an inverting input terminal thereof, and a voltage divided by the voltage divider inputted to a non-inverting input terminal thereof, and that supplies the amplified voltages to a gate of the transistor, to thereby control an output voltage of the transistor; and a phase compensation capacitor formed of an interlayer film between electrode layers and overlaid two-dimensionally on the voltage divider, wherein the electrode layer closer to the semiconductor substrate is connected to the output terminal of the transistor, and a parasitic capacitance between the output terminal of the transistor and the voltage divider compensates a phase lag of an output signal from the transistor.

2. The semiconductor device according to claim 1, wherein the phase compensation capacitor is configured such that the electrode layer remote from the semiconductor substrate is connected to a differential output terminal of the differential operational amplifier element so that the phase compensation capacitor is disposed between the output terminal of the transistor and the differential output terminal of the differential operational amplifier element.

3. The semiconductor device according to claim 1, wherein the phase compensation capacitor is configured such that the electrode layer remote from the semiconductor substrate is connected to a non-inverting input terminal of the differential operational amplifier element so that the phase compensation capacitor is disposed between the output terminal of the transistor and the non-inverting input terminal of the differential operational amplifier element.

4. The semiconductor device according to claim 1, wherein the phase compensation capacitor is configured such that it is formed on only the first voltage divider resistor element of the voltage divider, and is connected to the output terminal of the transistor while overlaid two-dimensionally on the first voltage divider resistor element, and wherein a parasitic capacitance is generated only between the output terminal of the transistor and the first voltage divider resistor element.

5. A semiconductor device provided with a regulator circuit formed on a semiconductor substrate, comprising:

a transistor having a source and a drain, either of which is connected to a power supply terminal and an other of which is connected to an output terminal of the transistor;

voltage divider resistance elements comprising a first voltage divider resistor element and a second voltage divider resistor element connected together in series between a ground terminal and the output terminal of the transistor;

a differential operational amplifier element that differentially amplifies a reference voltage inputted to an inverting input terminal thereof, and a voltage divided by the voltage divider inputted to a non-inverting input terminal thereof, and that supplies the amplified voltages to a gate of the transistor, to thereby control an output voltage of the transistor; and a phase compensation capacitor formed of an interlayer film between electrode layers, that compensates a phase lag of an output signal from the transistor;

wherein the voltage divider is formed of the electrode layer of the phase compensation capacitor that is closer to the semiconductor substrate, and wherein a parasitic capacitance between the voltage divider and the output terminal of the transistor compensates the phase lag.

6. The semiconductor device according to claim 5, wherein the electrode layer of the phase compensation capacitor remote from the semiconductor substrate is formed on only the first voltage divider resistor element of the voltage divider and is connected to the output terminal of the transistor while overlaid on the first voltage divider resistor, and wherein the parasitic capacitance is generated only between the output terminal of the transistor and the first voltage divider resistor element.

7. A regulator comprising:

a transistor having first and second electrodes coupled to a power supply terminal and an output terminal of the transistor, and having a gate terminal;

first and second resistors formed in a surface of a semiconductor substrate and connected together in series as a voltage divider;

a differential operational amplifier having a first input terminal coupled to a divided voltage output by the voltage divider and a second input terminal coupled to a reference voltage, and that provides a differential output responsive thereto; and a phase compensation capacitor formed over the voltage divider and including first and second electrode layers with an interlayer film formed therebetween, the first electrode layer being formed closer to the semiconductor substrate than the second electrode layer and being connected to the output terminal of the transistor.

8. The regulator of claim 7, wherein the second electrode layer is coupled to the gate terminal of the transistor.

9. The regulator of claim 7, wherein the second electrode layer is coupled to the first input terminal of the differential operational amplifier.

10. The regulator of claim 9, wherein the phase compensation capacitor is formed only over the first resistor of the voltage divider.

11. A regulator formed on a semiconductor substrate, comprising:

a transistor having first and second electrodes coupled to a power supply terminal and an output terminal of the transistor, and having a gate terminal;

first and second resistors connected together in series as a voltage divider;

a differential operational amplifier having a first input terminal coupled to a divided voltage output by the voltage divider and a second input terminal coupled to a reference voltage, and that provides a differential output responsive thereto; and a phase compensation capacitor including first and second electrode layers with an interlayer film formed therebetween, wherein the voltage divider is formed of the first electrode layer of the phase compensation capacitor which is closer to the semiconductor substrate than the second electrode layer.

12. The regulator of claim 11, wherein the second electrode layer is coupled to the output terminal of the transistor.

13. The regulator of claim 11, wherein the second electrode layer of the phase compensation capacitor is formed only over the first resistor of the voltage divider.

14. The regulator of claim 13, wherein the second electrode layer is coupled to the output terminal of the transistor.

* * * * *